United States Patent
Durr

(10) Patent No.: US 6,399,927 B1
(45) Date of Patent: Jun. 4, 2002

(54) METHOD AND DEVICE FOR HIGH FREQUENCY TREATMENT OF PRODUCTS, RELATED MATERIALS AND USES

(75) Inventor: Henri Durr, rue Louis Blondin, Gresy sur Isere 73460 (FR)

(73) Assignees: Chapel et Cie, Barby; Henri Durr, Gresy sur Isere, both of (FR)

( * ) Notice: Subject to any disclaimer, the term of this patent is extended or adjusted under 35 U.S.C. 154(b) by 0 days.

(21) Appl. No.: 09/674,689

(22) PCT Filed: May 4, 1999

(86) PCT No.: PCT/FR99/01057

§ 371 (c)(1),
(2), (4) Date: Nov. 3, 2000

(87) PCT Pub. No.: WO99/57947

PCT Pub. Date: Nov. 11, 1999

(30) Foreign Application Priority Data

May 5, 1998 (FR) .............................................. 98 05910

(51) Int. Cl.[7] .................................................. H05H 1/30
(52) U.S. Cl. .............. 219/601; 219/121.54; 219/121.59
(58) Field of Search ................................. 219/601, 629, 219/630, 635, 660, 666, 121.36, 121.54, 121.59

(56) References Cited

U.S. PATENT DOCUMENTS

| | | | | |
|---|---|---|---|---|
| 3,440,387 A | * | 4/1969 | Gartner | 219/121.36 |
| 5,111,024 A | * | 5/1992 | Patron et al. | 219/121.54 |
| 5,234,529 A | * | 8/1993 | Johnson | 156/345 |
| 5,383,019 A | * | 1/1995 | Farrel et al. | 219/121.54 |

FOREIGN PATENT DOCUMENTS

| | | |
|---|---|---|
| DE | 2628048 | 12/1977 |
| EP | 0408135 | 1/1991 |
| EP | 0851572 | 7/1998 |
| FR | 2683422 | 5/1993 |
| WO | 9116804 | 10/1991 |

* cited by examiner

Primary Examiner—Joseph Pelham
(74) Attorney, Agent, or Firm—Dowell & Dowell, P.C.

(57) ABSTRACT

The invention concerns a device for high frequency treatment of a liquid, solid or gaseous product comprising at least one treatment inductance (2) enclosing a tubular conduit (1) designed to be passed through by a stream of the product to be treated, said inductance (2) being powered by a high-frequency generator (3) via coupling means (22, 24). The inductance (2) has non-contiguous windings and the high-frequency generator (3) comprises a single oscillator power tube (4) connected to the high voltage distribution line, an oscillatory circuit with distributed constant (15) whereof the characteristics L, C determine the oscillation frequency required from the generator, said oscillatory circuit (15) being connected to the oscillator tube (4) anode via an insulating capacitor (14) relative to the high voltage supply continuous component, the high voltage distribution line being connected to the tube (4) cathode (5) via an element (6, 17, 18) determining the voltage and the high frequency signal phase, forming part of a complex reaction circuit connected between the oscillatory circuit (15) and the oscillating lamp (4) cathode (5).

21 Claims, 1 Drawing Sheet

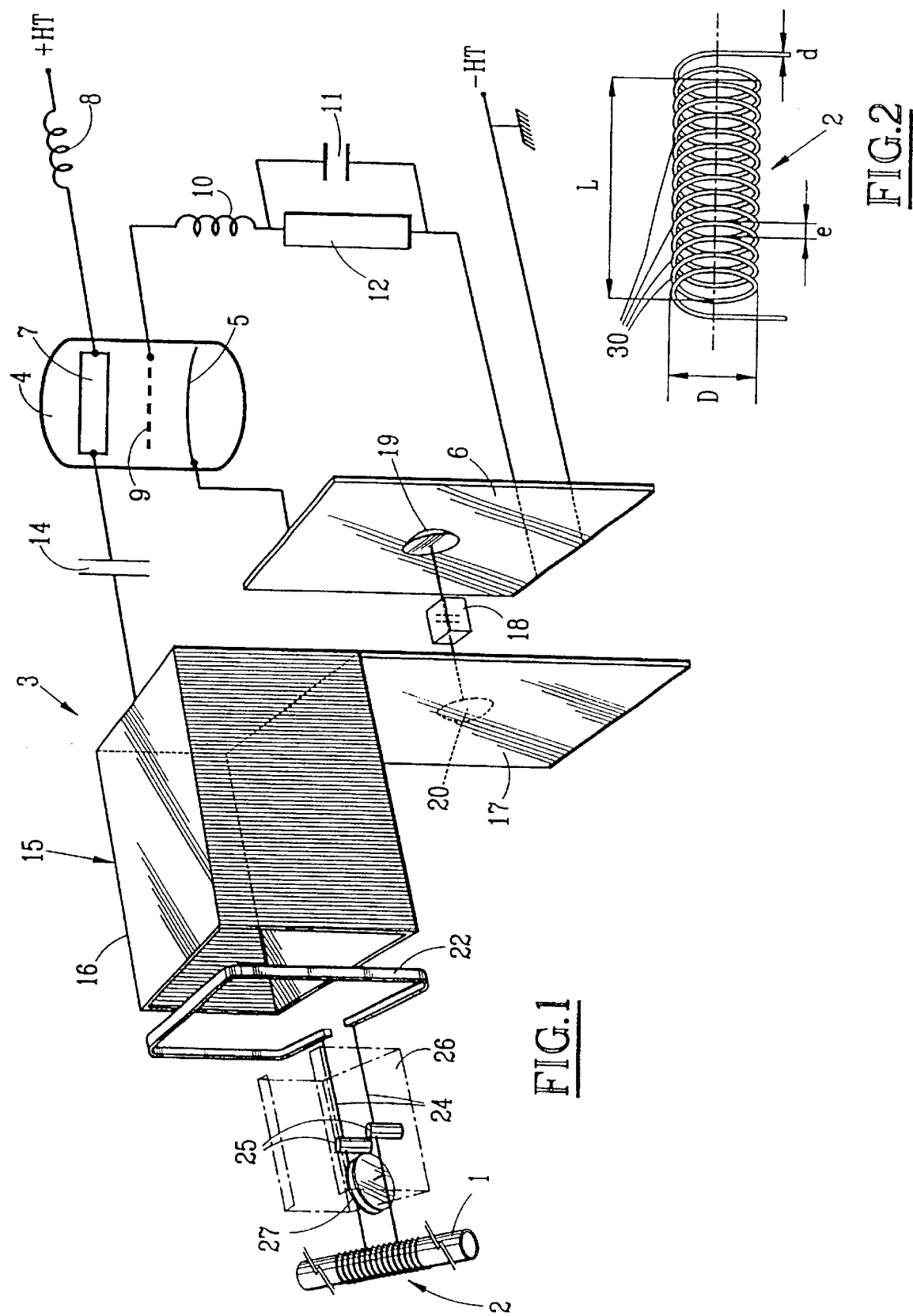

METHOD AND DEVICE FOR HIGH FREQUENCY TREATMENT OF PRODUCTS, RELATED MATERIALS AND USES

BACKGROUND OF THE INVENTION

1. Field of the Invention

The present invention relates to high-frequency generators and relates more particularly to a high-frequency generator that can be used especially with a plasma torch in which the treated gas is subjected to a high-frequency field.

2. Description of the Related Art

Patent FR 89 02 512 describes a high-frequency inductive plasma burner intended for the treatment of toxic or nontoxic effluents. This burner is subjected to a high-frequency field initiating the plasma on the very product to be treated.

It comprises a moveable part or a lateral injection allowing the flux of containment air to be adjusted, the torch being ignited by an electrostatic device, an adjustable orifice allowing the internal pressure in the torch to be modified, a spectral analyzer associated with a computer controlling the power of the generator, a suction at the outlet enabling the internal pressure to be reduced and an exchanger enabling the excess heat to be recovered.

High-frequency generators have been used for a long time for induction heating, for dielectric heating and for producing plasma flames from a gas and/or liquid jet and the like.

Such generators are usually designed to meet the requirements of a precise application but they are not suitable for all the abovementioned applications.

Their manufacturing cost is high because of the components used, such as the high-voltage capacitors, which may or may not have low losses, the power transmission lines and at least two power triodes.

SUMMARY OF THE INVENTION

The invention aims to remedy the aforementioned drawbacks of the known high-frequency generators by creating a high-frequency generator which can be used in many applications, especially those mentioned above, while at the same time having a low manufacturing cost compared with the known high-frequency generators.

The subject of the invention is therefore a method for the high-frequency treatment of a solid, liquid or gaseous product, consisting in making the product pass through an inductor supplied by a high-frequency generator, characterized in that the inductor has nontouching turns and in that said method consists in subjecting the product to an electrostatic treatment due to the effect of the capacitive impedance between the turns of the inductor and then in subjecting the product to an inductive treatment due to the effect of the inductive impedance of the said inductor.

The subject of the invention is also an inductor for the treatment of products, intended for implementing the method as defined above, comprising several turns which form a passage for a product to be treated, characterized in that the pitch of the turns and/or their diameter and/or the cross section of the wire forming the inductor depend on the frequency of the supply signal for the inductor.

The subject of the invention is also a high-frequency generator for the treatment of a solid, liquid or gaseous product by a high-frequency signal, characterized in that it comprises a single oscillating power lamp connected to a high-voltage supply line, an oscillating circuit with a distributed constant, the LC characteristics of which determine the desired oscillation frequency of the generator, said oscillating circuit being connected with the aid of the oscillating lamp via an isolating capacitor for blocking the DC component of the high-voltage supply, the high-voltage supply line being connected to the cathode of the lamp via an element for determining the voltage and the phase of the high-frequency signal and forming part of a complex feedback circuit connected between the oscillating circuit and the cathode of the oscillating lamp.

The subject of the invention is also an apparatus for the high-frequency treatment of a liquid, solid or gaseous product, comprising at least one treatment inductor surrounding a tubular pipe through which a stream of the product to be treated is intended to pass, said inductor being supplied by a high-frequency generator, characterized in that the inductor is an inductor as defined above and the high-frequency generator is a generator as defined above, the inductor being connected to the high-frequency generator via a frame coupled by mutual induction to the oscillating circuit, two matching lines connecting the frame to the inductor and a tuning capacitor forming, with the inductor, a circuit resonant at the frequency of the oscillating circuit.

Finally, the subject of the invention is the use of the method and of the equipment described above for:

reducing the amount and the average size of solid particles in a gas and/or stripping solid particles off an organic gangue.

DESCRIPTION OF THE DRAWINGS

The invention will be more clearly understood on reading the description that follows, with reference to the appended drawings, given solely by way of example and in which:

FIG. 1 is a schematic view of an apparatus for the treatment of products, which includes a high-frequency generator according to the invention; and FIG. 2 is a more detailed schematic view of the inductor which forms part of the treatment apparatus of FIG. 1.

DESCRIPTION OF THE PREFERRED EMBODIMENTS

FIG. 1 shows an apparatus for the high-frequency treatment of a liquid, solid or gaseous product, especially for the destruction of toxic or nontoxic products, which includes a tubular pipe 1, for example made of quartz, connected to a source (not shown) of effluents to be treated, around which pipe is wound an inductor 2 having nontouching turns and the function of which will be described in detail below.

According to a variant, this pipe may surround the inductor.

According to another variant, the apparatus may not have a pipe, the path of the product to be treated then being defined by the inside of the inductor 2.

The inductor 2 is supplied by a high-frequency generator, denoted by the overall reference number 3, and which includes an oscillating lamp 4, such as a power triode or a tetrode, connected to the terminals of a high-frequency line.

The cathode 5 of the lamp 4 is connected to the negative terminal of the grounded high-voltage supply line via a line 6 of length equal to a fraction smaller than or equal to one quarter of the wavelength of the high-frequency signal to be generated, for example a λ/4 quarterwave line formed by a plane metal plate, preferably made of aluminum. The anode 7 of the lamp 4 is connected to the positive terminal of the high-voltage supply line via a blocking choke 8.

The grid 9 of the lamp 4 is connected to the negative terminal of the high-voltage supply line via a gate circuit formed from a blocking choke 10 series-connected to a circuit formed by a capacitor 11 of a resistor 12 which are connected in parallel.

The anode of the lamp 4 is furthermore connected via an isolating capacitor 14 to an oscillating circuit 15 with a distributed constant.

The isolating capacitor 14 isolates the oscillating circuit from the DC component of the high-voltage supply line.

The oscillating circuit 15 with a distributed constant is formed by a hollow tubular metal body 16, of bottomless parallelepipedal shape, an open end of the body 16 directed toward the quarterwave line 6 connected to the cathode 5 of the lamp 4 being extended by a plate 17 which forms a line element and is placed so as to face the line 6. A capacitor 18 connected via moving contacts 19, 20 to the line 6 and to the plate 17, respectively, forms a feedback circuit.

The capacitor 18 can be replaced with the capacitor formed directly between the plates 6 and 17, placed judiciously close together with the possible interposition of a dielectric, the relative permeability of which may be used as a parameter for adjusting the capacitance.

The perimeter of the body 16 constitutes the inductor of the oscillating circuit and the surfaces of the body, which face each other in pairs, form the capacitor of said circuit.

Placed facing that open face of the body 16 of the oscillating circuit 15 with a distributed constant which is on the opposite side from the line 6 is a metal frame 22 connected via two lines 24, which are fastened, by means of insulating studs 25 to a shield 26 shown by the dot-dash lines, to the terminals of the inductor 2. The frame is coupled to the tubular body 16 by mutual induction.

The elements 6, 16, 17, 22 and 24 are made of aluminum, which gives them an attractive manufacturing cost and allows them to be easily formed.

However, other metals or metal alloys can be used, especially a stainless steel. It is also conceivable to produce these parts by depositing an electrically conducting layer on an insulating or conducting support.

A capacitor 27 for adjusting the LC circuit, in order to ensure that the oscillating circuit 15 with a distributed constant is in resonance, is connected between the lines 24 for linking the frame 22 to the inductor 2.

This capacitor is an air capacitor consisting of two circular plates arranged opposite each other. It is placed inside the shield 26.

The feedback capacitor 18 connected via the moving contacts 19, 20, to the lines 6 and 17 can be adjusted along these lines, either manually or by a suitable device, which may or may not be slaved to one or other of the characteristics of the generator.

The shape of the inductor 2 must be tailored to the nature of the products to be treated. This inductor will therefore be described in greater detail with reference to FIG. 2.

The nontouching turns 30 of the inductor 2 spaced apart by a distance e may be regarded as forming a succession of capacitors. Each space e is the seat of a high electric field.

In the case of the treatment of pulverulent material flowing in the tubular pipe 1, when the voltage is applied to the inductor 2 via the high-voltage generator and multiplied by the quality factor Q of the circuit, an electric field appears between each powder particle of the pulverulent material flowing in the pipe 1, said electric field being intense enough to cause an electrical discharge whose thermal effect raises the temperature of a group of particles.

When the temperature is high enough, the magma of particles becomes conducting and the above electrostatic-type coupling becomes electromagnetic and is exerted on a conducting bar consisting of the group of preheated particles.

In order for the system to operate, it has been shown experimentally that the following conditions must be respected.

The inductor 2 must have several turns 30 since it is the inter-turn distributed capacitance which generates the capacitive phenomenon. The distributed capacitance depends on the inter-turn distance e, on the diameter d of the conductor used for making the inductor 2, on the number n of turns 30 and on the diameter D of the inductor.

The inductor 2 and its tuning capacitor 27, which form a conventional LC circuit must have a high Q-factor. It is the Q thus obtained which allows interparticle ionization. The choice of the number of turns of the inductor 2 allows the voltage to be divided between the turns with a value of V/n, V being the voltage across the terminals of the inductor 2 and n being the number of turns 30.

The frequency at which the high frequency generator operates is optimal when it lies between 50 and 100 MHz, but probative results are obtained at lower frequencies between 10 and 20 MHz.

The inductor 2 has given good results when it is produced with the coil forming the inductor 2 having a length L equal to 1.5 times its diameter D for an inter-turn spacing e of about 5 mm in case of materials having a small particle size, to 20 mm in the case of materials having a larger particle size.

The cross section of the conductor forming the coil may be circular, square or rectangular.

In the case of a conductor in the form of wire, a diameter d of between 2 and 20 mm gives satisfactory results. A conductor in the form of a strip can also be used.

For products such as sludge containing water or a conducting ionized liquid, coupling in the frequency range of about 60 to 100 MHz firstly allows liquid to be evaporated and secondly allows the solid matter to be melted, provided that the solid matter is or has become conducting by a thermal or non-thermal effect.

The adjustments are virtually the same as for pulverulent material, except that the efficiency improves by increasing the frequency.

Few results at 20 MHz and good results at 90 MHz have been observed. The optimum spacing between the turns 30 is about 2 to 3 mm. It must be high enough to prevent discharges between the turns 30.

For the treatment of gases, the operating conditions for the inductor 2, which are associated with the high-frequency generator according to the invention, are as follows.

The flow of the gases in the tubular pipe 1 surrounded by the inductor 2 relies on the same properties as a flow of pulverulent materials.

After applying power to the high-frequency generator 3, an intense electric field is produced between the turns 30 of the inductor 2, this electric field depending on the Q-factor and on the inter-turn distributed capacitance.

Ignition takes place by sparking between one of the turns 30 and a conducting body placed near the latter. Next, since the spark constitutes a conducting microplasma, electromagnetic coupling occurs over this microplasma and causes a substantial chain reaction throughout the internal space of the coil 2, which is not cooled.

It is possible to add additional inductors to the inductor 2, these additional inductors being parallel-connected to the terminals of the high-frequency generator and placed along the tubular pipe 1 containing the product to be treated. Such an arrangement makes it possible to obtain very long plasma flames.

It has been found by experiment that the inductors are judiciously arranged if the space between two inductors corresponds to a diameter D of the inductor.

The following operating conditions have also been determined experimentally:

frequency range: from 20 to 100 MHz diameter of the inductors: from 20 mm to 250 mm number of turns: 4 to 18 turns.

Four turns correspond to a frequency of 100 MHz and 20 turns correspond to a frequency of 20 MHz.

Thanks to the invention, the treatment of highly diluted combustible gases may be envisioned without the use of a catalyst of the ceramic or platinum foam type, the implementation being simplified and the operating cost reduced.

Returning now to FIG. 1, this shows that the feedback capacitor 18 associated with the capacitor specific to the lamp 4, by moving its moving contacts along the lines 6 and 17, allows the point of operation of the high-frequency generator to be adjusted.

The oscillating circuit 15 with a distributed constant consisting of a parallelepipedal body 16 made of a conducting metal, preferably aluminum, makes it possible to obtain, for a low cost, LC characteristics which depend on the geometry and on the dimensions of said body and which determine the desired oscillation frequency of preferably between 20 and 100 MHz.

The high-frequency generator which forms part of the treatment apparatus shown in FIG. 1 can be used indiscriminately to treat products which require electrostatic coupling, electromagnetic coupling or else strong electrostatic coupling at the start of the process and strong electromagnetic coupling during the treatment process, which may or may not be combined with electrostatic coupling.

With a solid, liquid or gaseous product, the flame temperature obtained by the apparatus and the method of the invention can be reduced compared to that of the prior systems since it is possible to create a flame of long length and large diameter. Flames having a length of greater than 30 m and a diameter of greater than 100 mm have been able to be obtained experimentally.

According to one particularly advantageous application, the invention makes it possible to treat gaseous effluents which contain, usually, solid particles having a mean diameter of between 1 and 3 microns. These particles are, for the most part, covered with an organic gangue which is likely to confer pathogenic properties thereon. It turns out that, after the treatment by the method or the apparatus of the invention, the amount of particles present in the gas is reduced in a proportion of 5 to 1, while their mean diameter is reduced in a range of between 0.3 and 0.5 microns. Moreover, after treatment, the particles are free of any organic gangue.

What is claimed is:

1. In an inductor for high frequency treatment of a solid, liquid or gaseous product wherein the product passes through a plurality of spaced turns (30) of an inductor (2) supplied by a high-frequency generator (3), and wherein the product is subjected to a capacitive treatment due to the effect of capacitive impedance between the turns of the inductor and then subjected to an inductive treatment due to an effect of an inductive impedance of the inductor, the improvement comprising a spacing (e) of the turns (30) and/or their diameter (D) and/or a diameter (d) of a conductor forming the inductor depend on a frequency of a supply signal for the inductor.

2. The inductor as claimed in claim 1, wherein the spacing (e) between the turns (30) thereof is between 2 and 20 mm.

3. The inductor as claimed in claim 1 wherein the diameter (D) of the turns is between 20 and 250 mm.

4. The inductor as claimed in claim 1 wherein the diameter (d) of the conductor forming the inductor is between 2 and 20 mm.

5. A high-frequency generator connected for supplying an inductor as claimed in claim 2, which generator comprises a single oscillating lamp (4) connected to a high-voltage supply, an oscillating circuit (15) with a distributed constant, LC characteristics of which determine a desired oscillation frequency of the generator, said oscillating circuit (15) being connected to an anode of the oscillating lamp (4) via an isolating capacitor (14) for blocking a DC component of the high-voltage supply, the high-voltage supply being connected to a cathode (5) of the oscillating lamp (4) via an element (6, 17, 18) for determining voltage and phase of a high-frequency signal and forming part of a feedback circuit connected between the oscillating circuit (15) and the cathode (5) of the oscillating lamp (4).

6. The generator as claimed in claim 5, wherein the oscillating circuit (15) comprises a bottomless parallelepipedal hollow metal body (16), a perimeter of which constitutes the inductor and lateral surfaces of which, facing each other in pairs, form the capacitor, one of said lateral surfaces of said metal body being extended by a line element (17) linking the oscillating circuit (15) to the feedback circuit.

7. The generator as claimed in claim 5, wherein the element for determining the voltage and the phase of the high-frequency signal comprises a line (6) having a length equal to a fraction of a negative terminal of the high-voltage supply.

8. The generator as claimed in claim 7, wherein the feedback circuit comprises a capacitor (18) connected between said line (6) of a length equal to a fraction of the wavelength and the line element (17) connected to the oscillating circuit (15).

9. The generator as claimed in claim 8, wherein the capacitor (18) of the feedback circuit is connected to the line (6) and to the line element (17) connected to the oscillating circuit via contact (19, 20) which can move along the line (6) and the line element (17).

10. The generator as claimed in claim 5, characterized in that the element for determining the voltage and the phase of the high-frequency signal is a plane plate made of a metal which is a good electrical conductor.

11. An apparatus for the high-frequency treatment of a liquid, solid or gaseous product, comprising at least one treatment inductor (2) having spaced turns (30) surrounding a tubular pipe (1) through which a stream of the product to be treated is intended to pass, said inductor (2) being supplied by a high-frequency generator (3), a spacing (e) of the inductor turns (30) and/or their diameter (D) and/or a diameter (d) of a conductor forming the inductor depend on a frequency of a supply signal for the inductor, the high-frequency generator (3) being a generator as claimed in claim 6, the inductor (2) being connected to the high-frequency generator (3) via a frame (22) coupled by mutual induction to the oscillating circuit (15), two matching lines (24, 25) connecting the frame (22) to the inductor (2) and a tuning capacitor (27) forming, with the inductor, a circuit resonant at the frequency of the oscillating circuit (15).

12. The treatment apparatus as claimed in claim 11, wherein the matching lines (24, 25) and the tuning capacitor. (27) are mounted in a shielding element (26).

13. The treatment apparatus as claimed in claim 11, for the treatment of pulverulent products, wherein an operating frequency of the high-frequency generator (3) is between 10 and 100 MHz.

14. The treatment apparatus as claimed in claim 13, wherein a length (L) of the inductor (2) is equal to 1.5 times its diameter (D) and the spacing (e) between the turns (30) of the inductor is between 5 mm and 20 mm.

15. The treatment apparatus as claimed in claim 11 for the treatment of sludge, wherein, for an operating frequency of the high-frequency generator (3) equal to 90 MHz, the spacing (e) between the turns of the inductor is from 2 to 3 mm.

16. The treatment apparatus as claimed in claim 11, for the treatment of gaseous products, wherein an operating frequency of the high-frequency generator (3) is between 20 and 100 MHz.

17. The treatment apparatus as claimed in claim 15, wherein the diameter of the inductor (2) is between 20 and 250 mm and the number of turns (30) of the inductor (2) is between 4 and 18.

18. Use of the apparatus claimed in claim 11 for reducing an amount and an average size of solid particles in a gas.

19. Use of the apparatus claimed in claim 11 for stripping an organic gangue from solid particles.

20. Use of an inductor as claimed in claim 1 for reducing an amount and an average size of solid particles in a gas.

21. Use of an inductor as claimed in claim 1 for stripping an organic gangue from solid particles.

* * * * *